United States Patent
Herterich et al.

(10) Patent No.: US 12,308,639 B2
(45) Date of Patent: May 20, 2025

(54) METHOD FOR IDENTIFYING ASYMMETRICAL VIBRATIONS WHEN OPERATING AN ELECTRICAL DEVICE CONNECTED TO A HIGH-VOLTAGE GRID

(71) Applicant: Siemens Energy Global GmbH & Co. KG, Munich (DE)

(72) Inventors: Holger Herterich, Nuremberg (DE); Franz Klammler, Passail (AT); Ruediger Kutzner, Zirndorf (DE); Harald Mayer, Roethenbach an der Pegnitz (DE); Marc Weber, Nuremberg (DE)

(73) Assignee: Siemens Energy Global GmbH & Co. KG, Munich (DE)

( * ) Notice: Subject to any disclaimer, the term of this patent is extended or adjusted under 35 U.S.C. 154(b) by 782 days.

(21) Appl. No.: 17/629,935

(22) PCT Filed: Jul. 9, 2020

(86) PCT No.: PCT/EP2020/069428
§ 371 (c)(1),
(2) Date: Jan. 25, 2022

(87) PCT Pub. No.: WO2021/013573
PCT Pub. Date: Jan. 28, 2021

(65) Prior Publication Data
US 2022/0294262 A1    Sep. 15, 2022

(30) Foreign Application Priority Data

Jul. 25, 2019    (DE) ............... 10 2019 211 040.1

(51) Int. Cl.
*H02J 13/00*    (2006.01)
*G01R 23/16*    (2006.01)
(Continued)

(52) U.S. Cl.
CPC ........ *H02J 13/00002* (2020.01); *G01R 23/16* (2013.01); *G01R 31/62* (2020.01); *H02J 13/00032* (2020.01); *H02J 2203/10* (2020.01)

(58) Field of Classification Search
CPC .......... H02J 13/00002; H02J 13/00032; H02J 2203/10; H02J 3/00; G01R 23/16;
(Continued)

(56) References Cited

U.S. PATENT DOCUMENTS

2014/0156032 A1    6/2014    Jenkins et al.
2018/0024205 A1    1/2018    Kim et al.
(Continued)

FOREIGN PATENT DOCUMENTS

CN    106199226 B    12/2016
CN    106249076 A    12/2016
(Continued)

OTHER PUBLICATIONS

Sundermann, Ulrich et al: "Das Verhalten von Leistungstransformatoren bei Beanspruchung mit Gleichströmen"; Jun. 3, 2016; DE; pp. 1-12; URL: http://www.researchgate.net/profile/Michael_Beltle/publication/296958913_Das_Verhalten_von_Leistungstransformatoren_bei_Beanspruchung_mit_Gleichstromen/links/56dc0ee908-aebabdb4141ba6 [retrieved on May 5, 2020]; 2016.
(Continued)

*Primary Examiner* — Michael J Brown
(74) *Attorney, Agent, or Firm* — Laurence A. Greenberg; Werner H. Stemer; Ralph E. Locher

(57) ABSTRACT

A method for identifying asymmetrical vibrations during the operation of an electric device which is connected to a high-voltage grid: Operational noise of the electric device is detected using acoustic sensors which output measured values. The measured values and/or values derived therefrom are transmitted to a communication unit via a close-
(Continued)

range communication connection and then transmitted to a data processing cloud via a far-range communication connection. The measured values and/or the values derived from the measured values are separated into frequency components by the data processing cloud using a Fourier transformation, thereby obtaining a frequency spectrum. Odd and even frequency components of the frequency spectrum are ascertained on the basis of a base frequency of the high-voltage supply grid and put into a ratio R relative to one another. The presence of asymmetrical vibrations is indicated if the ratio R exceeds a specified threshold.

9 Claims, 2 Drawing Sheets

(51) Int. Cl.
*G01R 31/62* (2020.01)
*G01D 21/02* (2006.01)
*H02J 3/00* (2006.01)

(58) Field of Classification Search
CPC ......... G01R 31/62; G01R 31/72; Y04S 10/30; G01D 21/02
USPC .......................................................... 700/286
See application file for complete search history.

(56) References Cited

U.S. PATENT DOCUMENTS

| | | | |
|---|---|---|---|
| 2018/0226796 A1* | 8/2018 | Anderson | H02J 3/01 |
| 2020/0393521 A1 | 12/2020 | Bayoumi et al. | |

FOREIGN PATENT DOCUMENTS

| | | |
|---|---|---|
| CN | 108508318 A | 9/2018 |
| CN | 108519526 A | 9/2018 |
| DE | 202018004493 U1 | 11/2018 |
| DE | 102019207358 A1 | 11/2020 |
| EP | 3736580 A1 | 11/2020 |
| EP | 3783630 A1 | 2/2021 |
| KR | 20170053304 A | 5/2017 |
| WO | 2017194349 A1 | 11/2017 |
| WO | 2018165636 A1 | 9/2018 |

OTHER PUBLICATIONS

Liu, Xingmou et al: "Vibration characteristic investigation on distribution transformer influenced by DC magnetic bias based on motion transmission model"; Electrical power and energy systems,; vol. 98; 2018; pp. 389-398; ISSN 0142-0615; 2018.

Adnan Secic et al: "Vibro-Acoustic Methods in the Condition Assessm gefunden am ent of Power Transformers: A Survey", IEEE Access, Bd. 7, Jan. 1, 2019 (Jan. 1, 2019), pp. 83915-83931, XP055733464, DOI: 10.1109/ACCESS.2019.2923809.

Dr. Amit Kumar Manocha, et al: "Transformer Health Monitoring using Cloud Computing", Sep. 30, 2018 (Sep. 30, 2018), XP055733460, Found on the internet: URL:http://www.liarntes.org/gallery/112%20sect%20ijmte%20-%20cw.pdf, [found on Sep. 23, 2020].

* cited by examiner

METHOD FOR IDENTIFYING ASYMMETRICAL VIBRATIONS WHEN OPERATING AN ELECTRICAL DEVICE CONNECTED TO A HIGH-VOLTAGE GRID

FIELD AND BACKGROUND OF THE INVENTION

The invention relates to a method for identifying asymmetrical vibrations when operating an electrical device which is connected to a high-voltage grid.

In electrical transformers, as are used in energy transmission and distribution grids, an undesired infeed of a direct current, for example into the windings, may occur. Power electronics components in the grid, for example the actuation of electrical drives, converters for flexible AC transmission systems or high-voltage DC current transmission, may also create direct currents in the electrical device. Another cause for direct currents may be what are known as "geomagnetically induced currents" (hereinafter also referred to as GIC for short).

A DC current component in the core of the transformer results in a magnetic DC flux component that is overlaid on the AC flux. This results in asymmetric modulation of the magnetic material in the core, which entails a number of disadvantages. Even a DC current of a few amperes leads to saturation of the core with magnetic flux. This is associated with a significant increase in losses in the core (for example: 20-30%). Heating problems may occur in particular in the case of large GIC. Furthermore, during operation, there is increased noise emission, which is perceived to be particularly disruptive in particular when the transformer is installed close to a residential area.

Various apparatuses with an active and passive effect are known for the purpose of DC current compensation or reducing operating noise of a transformer as electrical device. Before expensive DC current compensation measures are taken, however, it is necessary to be certain as to whether such a DC current component is actually present. It is known that, when an electrical device is operated, DC current components that flow in the electrical device lead to asymmetrical vibrations of the electrical device.

SUMMARY OF THE INVENTION

The object of the invention is therefore to provide a method of the type mentioned at the outset by way of which it is easily, quickly and reliably possible to identify whether the electrical device vibrates asymmetrically during operation in an electricity supply grid carrying a high voltage.

The invention achieves this object by operational noise of the electrical device being acquired using acoustic sensors which provide measurement values on the output side, the measurement values and/or the values derived from the measurement values being transmitted to a communication device via a short-range communication connection, the measurement values and/or the values derived from the measurement values being transmitted from the communication unit to a data processing cloud via a long-range communication connection, the measurement values and/or the values derived from the measurement values being broken down into their frequency components by the data processing cloud by means of a Fourier transformation so as to obtain a frequency spectrum, odd and even frequency components of the frequency spectrum being ascertained on the basis of a fundamental frequency of the high-voltage supply grid and being set into a ratio R with one another, and the presence of asymmetrical vibrations being indicated if the ratio R exceeds a predetermined threshold value.

The invention makes it easily, quickly and reliably possible to identify whether asymmetrical vibrations are occurring in an electrical device, such as for example a power transformer, during operation. Until now, the proof of asymmetrical vibrations has been provided by complex electrical measurements or acoustic measurement series at the electrical device. The analysis of the measurement data has had to be carried out by experts. In other words, the previously known methods resulted in high costs. In contrast, the method according to the invention is not only cost-effective but may also be implemented easily, without particular knowledge in the art being required. It may therefore be carried out by any users, for example the operators of the electrical device. If asymmetrical vibrations are indicated, suitable measures for suppressing these may be taken.

During operation of the electrical device, this is connected to a high-voltage grid within the context of the invention. The electrical device is therefore designed for high voltages and is for example a transformer, in particular a power transformer, or an inductor. A transformer of this kind or an inductor of this kind preferably has a tank filled with an insulating fluid. An active part, which has a magnetizable core and at least one winding, is arranged in the tank. During operation, at least one winding is connected to the high-voltage grid carrying the AC voltage. By way of example, an ester fluid or a mineral oil is considered as insulating fluid. In addition to the electrical insulation of the active part with respect to the tank that is at ground potential, said insulating fluid is also used to cool the components.

In mathematical terms, the method according to the invention for indicating asymmetrical vibrations may be described as follows. Let $S_{xN}$ be the signal value of the frequency spectrum in arbitrary units, wherein x stands for even (x=g), odd (x=u) or noise (x=n). N is the ordinal number of the signal, wherein N=1 corresponds to the fundamental frequency and N=2, 3, 4, . . . , Nmax corresponds to the harmonics. Even frequencies $f_{gN}$ arise in the case of a supply voltage of 50 Hz in accordance with $f_{gN}=50*2*N$. Odd frequencies arise in accordance with $f_{uN}=50*(2*N+1)$. A DC current component in the electrical device causes an additional odd component on the overall spectrum. If the sum of all of the odd components on the overall spectrum is then set in a ratio R to the even components on the overall spectrum and this ratio R exceeds a previously defined threshold value, it is possible to conclude the presence of asymmetrical vibrations. The size of R expresses the effect of the asymmetrical vibrations on the core. Asymmetrical vibrations may indicate a DC current component flowing via the electrical device.

Within the context of the invention, the communication unit has for example at least one analog and at least one digital input. It is thus possible for a plurality of sensors to be connected to one communication unit. Not all of the sensors have to be acoustic sensors. The communication unit may also be connected to current, voltage, temperature or pressure sensors. For example, the communication unit has a main and an auxiliary processor as well as a storage unit, in which preprocessed measurement values or values derived therefrom may be stored and processed, for example by means of average value formation. The measurement values from various sensors may therefore be sent together from a communication unit to the data processing cloud via a long-range communication connection.

The user of the method according to the invention is for example an operator of an energy supply grid who is responsible for a number of transformers, circuit breakers, capacitor batteries, spark gaps or the like.

Within the context of the invention, any sensor that can acquire acoustic signals, that is to say sound waves, on the input side and provide electrical signals on the output side depending on the sound wave amplitude is considered as electrical sensor. Said electrical signals are referred to here as measurement values. The electrical signals may be analog electrical signals, for example an electric current or a voltage whose amplitude level corresponds to the sound wave received. Within the context of the invention, however, the measurement values may also be digital values that have been generated for example by sampling the analog signals so as to obtain sampling values and digitize the sampling values.

Within the context of the invention, each sensor is connected to the communication unit via a short-range communication connection. By way of example, the short-range communication connection may be a single cable. In a departure therefrom, the short-range communication connection is for example a ZigBee, Bluetooth, wireless, Ambus or WiFi communication connection. The short-range communication connection extends over a maximum of 100 meters.

Within the context of the invention, the communication unit and the data processing cloud are connected via a long-range communication connection. In order to establish this connection, the communication unit has a long-range communication device, such as a mobile radio module according to the GPRS or UMTS standard, for example. This is used to form a long-range communication connection, preferably an IP-based data connection, to the data processing cloud. In this case, for example, a provider of a mobile radio service or a telecommunications provider may be intermediately connected and the long-range communication connection may be established at least in part via a communication network of said provider and/or at least in part via the Internet. There is then only a very low degree of configuration or parameterization outlay in order to establish the connection. Apart from the configuration of the long-range communication device using the information required for forming the long-range communication connection, for example the installation of a SIM card of a telecommunications provider, no further outlay has to be expended for the individual communication unit.

A cloud or a data processing cloud should be understood here to mean an arrangement comprising one or more data storage devices and one or more data processing devices, which arrangement can be designed to carry out any desired data processing processes by way of suitable programming. In this case, the data processing devices generally constitute universal data processing devices, such as servers, for example, which initially have no specified design at all with regard to their construction and their programming. The universal data processing device can be upgraded to perform specific functions only by means of programming which is carried out.

Insofar as the cloud has a plurality of individual components, the latter are connected to one another in a suitable manner for data communication, for example by means of a communication network. Any desired data can be fed to a data processing cloud for data storage and/or processing. The data processing cloud itself in turn provides other devices, for example computer workstations, laptops, smartphones connected to a data processing cloud, with the stored data and/or the events of the data processing carried out. A data processing cloud can be provided for example by one computing center or else a plurality of networked computing centers. A data processing cloud is usually embodied spatially at a distance from the high-voltage devices.

The electrical device in the context of the invention is designed for operation in the voltage or high-voltage network, that is to say for an operating voltage of between 1 kV and 1200 kV, in particular 50 kV and 800 kV. The high-voltage network is preferably an AC voltage network.

According to the invention, an electrical device is for example a transformer, in particular a power transformer, an inductor or the like.

In a preferred configuration of the method according to the invention, the communication unit is a mobile telephone. What is known as a "smartphone" is particularly well-suited as mobile telephone. A smartphone is to be understood here as meaning a high-performance mobile telephone. Such mobile telephones are usually already provided with a microphone as acoustic sensor. Such a mobile telephone also has a memory and a programmable unit, for example at least one processor. However, the entire mobile telephone is not used here to carry out the method according to the invention. It is used on the one hand for connection to the data processing cloud. The mobile telephone acquires the noise of a transformer by means of its microphone and stores the measurement values obtained thereby in its storage unit. A connection to the data processing cloud to which the measurement values are sent individually or in averaged form takes place at predetermined time intervals.

In one variant of the method, the measurement values of a plurality of acoustic sensors are transmitted together to the data processing cloud. However, the measurement values may be preprocessed in advance, that is to say for example averaged over a measurement period.

The mobile telephone, that is to say another communication unit, advantageously has a storage unit on which the measurement values or the values derived from the measurement values are stored. The storage unit simplifies the possibly desired preprocessing of the measurement values.

The acoustic signals are preferably acquired at different locations close to the electrical device. For this purpose, the user records the noise of the electrical device at different positions or measurement locations with the aid of a portable acoustic sensor, for example in front of, next to and behind the electrical device. An average of the performed measurements is then formed for all of the frequency components from the respectively obtained spectra. Software preferably in this case guides the user interactively, so that the correct steps are able to be performed at the correct time.

The acoustic signals are advantageously acquired over a predefined duration. The duration is preferably in the range between 10 and 60 seconds for each measurement.

In an advantageous variant of the invention, the geographic location of the communication unit and the electrical device connected thereto is ascertained and transmitted to the data processing cloud by means of an antenna for position determination, which is arranged in the respective communication unit.

In a further advantageous configuration of the invention, the acoustic signals are acquired at various locations (A, B, C, D) close to the electrical device. In a departure therefrom, the sensor or the sensors is/are fixedly installed in the electrical device.

Further expedient embodiments and advantages of the invention are the subject matter of the following description of exemplary embodiments of the invention with reference to the figure of the drawing, with the same reference signs referring to functionally identical components, and wherein

DETAILED DESCRIPTION OF THE INVENTION

Figure 1:
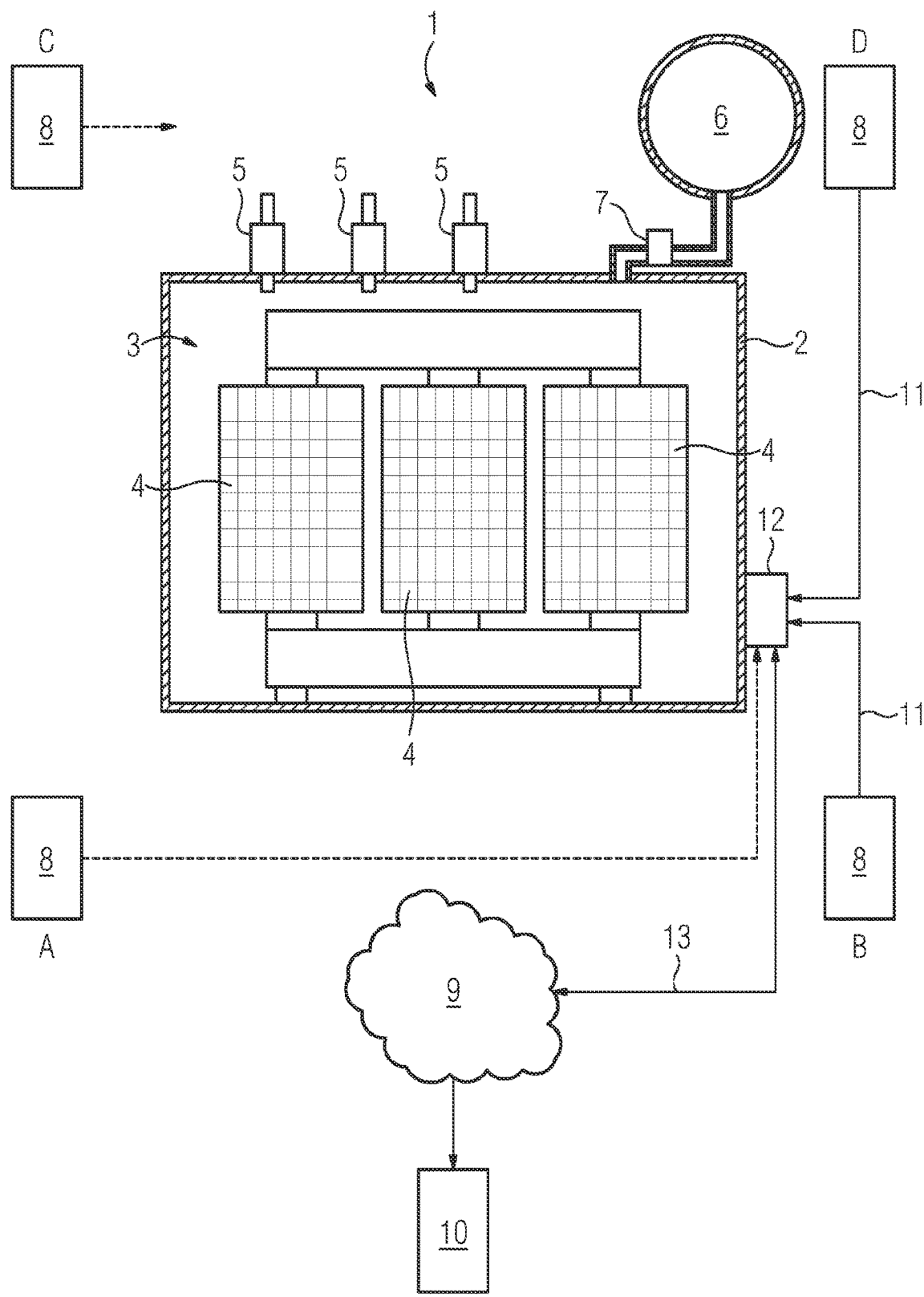
FIG. 1 schematically illustrates an exemplary embodiment of the method according to the invention and FIG. 2 schematically illustrates a further exemplary embodiment of the invention.

FIG. 1 shows an exemplary embodiment of the method according to the invention in which a transformer 1 is schematically illustrated as electrical device. The transformer 1 has a tank 2 that is filled with an insulating fluid such as an ester fluid or a mineral oil. A magnetizable core 3 is arranged in the tank 2 and forms a closed magnetic circuit. The limbs of the core 3 are each enclosed by two windings arranged concentrically to one another, only the outer high-voltage winding 4 of which is able to be seen. The windings are connected to the phases of a high-voltage grid carrying an AC voltage via bushings 5.

An expansion vessel 6 is used to compensate for temperature-induced volume fluctuations of the insulating fluid in the tank 2 of the transformer 1. A Buchholz relay 7 is able to be seen in the connecting line between the tank 2 and expansion vessel 6.

FIG. 1 also shows a portable acoustic sensor 2, which is illustrated purely schematically and which acquires the operating noise of the transformer 1 at four different locations A, B, C and D. The portable sensor 8 is connected to a communication unit 12, in this case a communication box, via a Bluetooth connection 11 as short-range communication connection. The communication box 12 is securely mounted on the outside to the wall of the tank 2. Said communication box has a storage unit on which the measurement values provided by the sensor 8 are stored in a spatially resolved manner. The communication box 12 is connected to a data processing cloud 9 via a long-range communication connection 13 every 2 minutes and sends the measurement values stored on its hard drive to a data processing cloud 9 via the long-range communication connection 13. Said data processing cloud carries out the analysis method described further above in order to detect asymmetrical vibrations.

Within the context of the invention, instead of a separate portable sensor 8, a mobile telephone can also be used for the purpose of sound measurement. To this end, the mobile telephone 8 contains software or an "app" that asks the person applying the method to perform the noise measurement over a predefined duration and then to change location in order to perform the measurement again there.

A microphone, not illustrated in the figures and already installed in the mobile telephone, is used for the noise measurement. The mobile telephone 8 stores the time-resolved acoustic signals generated by its microphone based on the measurement, after they have been digitized, in its storage unit, likewise not shown. The mobile telephone is subsequently connected to the data processing cloud 9 via the long-range connection and transmits the locally stored measurement values to the data processing cloud 9. Said data processing cloud comprises software that performs a Fourier transformation of the transmitted measurement values. This is followed by the formation of the ratio R, as already described above.

From the size of R, the method according to the invention derives whether and possibly to what extent asymmetrical vibrations are present and possibly to what order of magnitude the transformer is impacted by a DC current component. The user, by virtue of the result of the method, gains knowledge thereof and is then able to initiate appropriate countermeasures in order to suppress the possibly identified DC current component.

It is possible to access the data processing cloud using a laptop or computer 10 in order to obtain the result of the analysis.

Figure 2:
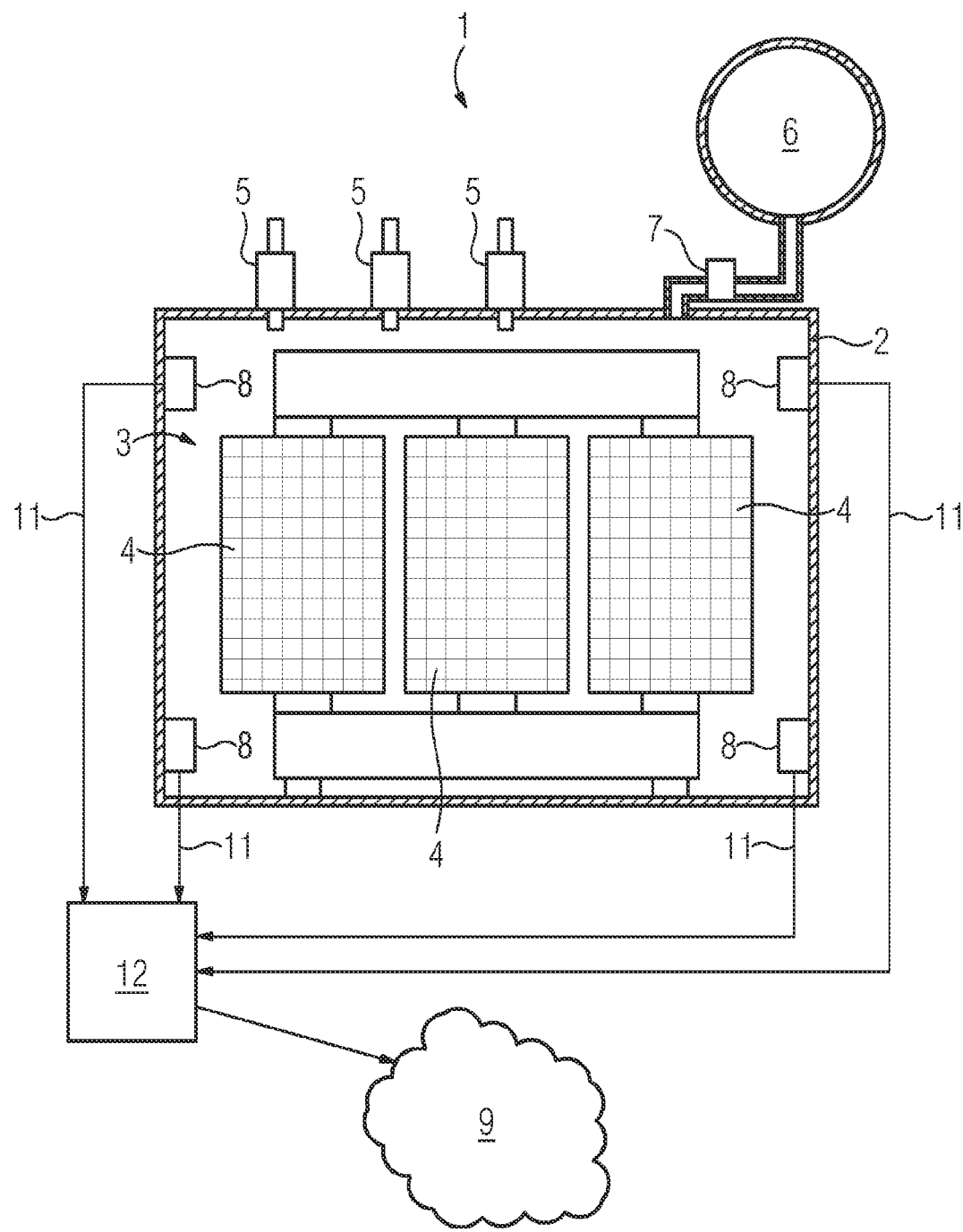

FIG. 2 shows a further exemplary embodiment for carrying out the method according to the invention; a transformer 1 can again be seen as electrical device, said transformer substantially corresponding to the transformer shown in FIG. 1. However, in contrast to the transformer shown in FIG. 1, the transformer 1 in accordance with FIG. 2 has four sensors 8 arranged inside the tank 2. Each sensor 8 is connected to a communication unit 12, which is not securely fastened to the transformer 1 in the exemplary embodiment shown, via a short-range communication connection 11, which is again formed as a Bluetooth connection. Instead, the communication unit 12 is located in a nearby housing, which is not illustrated in the figures and which is placed approximately 20 m away from the transformer 1.

The communication unit 12 has four inputs so that all four sensors 8 are connected to the communication unit 12 at the same time. The noise or sound waves generated during operation of the transformer 1 are acquired by the sensors 8, which generate an analog electrical signal, in this case a current, depending on the amplitude of the sound waves. The analog signals are sampled and the sampling values obtained therefrom are digitized. The digitized values are referred to here as measurement values.

Said measurement values are transmitted to the communication unit 12 via the short-range communication connection 11. Said communication unit has a storage unit, which is not shown in the figures, in which the measurement values are stored.

In one variant of the method according to the invention, the measurement values are preprocessed, that is to say for example the measurement values transmitted at a two-second clock are averaged over a period of 2 min and the averaged values are stored in the storage unit. The communication unit 12 establishes a connection with the data processing cloud 9 via a long-range communication connection 13 every 2 min. The measurement values or the averaged measurement values or values derived from the measurement values are transmitted to the data processing cloud 9. Said data processing cloud then uses suitable software to examine the measurement values; in other words, a Fourier transformation is carried out and the spectrum thus obtained is examined for the presence of asymmetrical vibrations. The analysis method is described in more detail further above.

The invention claimed is:

1. A method of identifying asymmetrical vibrations during an operation of an electrical device which is connected to a high-voltage grid, the method comprising:
   acquiring operational noise of the electrical device using acoustic sensors which provide measurement values on an output side;
   transmitting the measurement values and/or values derived from the measurement values to a communication unit via a short-range communication connection;
   transmitting the measurement values and/or the values derived from the measurement values from the communication unit to a data processing cloud via a long-range communication connection;

breaking down the measurement values and/or the values derived from the measurement values into their frequency components in the data processing cloud by way of a Fourier transformation so as to obtain a frequency spectrum;

ascertaining odd and even frequency components of the frequency spectrum based on a fundamental frequency of the high-voltage grid and determining a ratio R between the odd and even frequency components; and if the ratio R exceeds a predetermined threshold value concluding a presence of asymmetrical vibrations of the electrical device.

2. The method according to claim 1, which comprises storing the measurement values and/or values derived from the measurement values in a memory unit of the communication unit.

3. The method according to claim 2, which comprises ascertaining a geographic location of the communication unit and of the electrical device connected thereto and transmitting the geographic location to the data processing cloud by way of an antenna for position determination, which is arranged in the communication unit.

4. The method according to claim 2, wherein the communication unit is a mobile telephone.

5. The method according to claim 1, which the communication unit is one of a plurality of communication units each having a memory for storing the measurement values and/or values derived from the measurement values.

6. The method according to claim 1, which comprises acquiring the acoustic signals at various locations in close vicinity to the electrical device.

7. The method according to claim 1, which comprises acquiring the acoustic signals over a predefined period.

8. A computer program for a computation device, the computer program being configured for executing the method according to claim 1.

9. A computer program product, comprising a non-transitory storage medium containing a computer program configured for executing the method according to claim 1 when the program is loaded into a computer.

* * * * *